(12) United States Patent
Hou

(10) Patent No.: US 9,915,586 B2
(45) Date of Patent: Mar. 13, 2018

(54) METHOD FOR PROCESSING A SIGNAL SUPPLIED BY A BI-DIRECTIONAL SENSOR AND CORRESPONDING DEVICE

(71) Applicants: CONTINENTAL AUTOMOTIVE FRANCE, Toulouse (FR);
CONTINENTAL AUTOMOTIVE GMBH, Hannover (DE)

(72) Inventor: Jerome Hou, Saint-Alban (FR)

(73) Assignees: CONTINENTAL AUTOMOTIVE FRANCE, Toulouse (FR);
CONTINENTAL AUTOMOTIVE GmbH, Hannover (DE)

( * ) Notice: Subject to any disclaimer, the term of this patent is extended or adjusted under 35 U.S.C. 154(b) by 268 days.

(21) Appl. No.: 14/647,289

(22) PCT Filed: Nov. 26, 2013

(86) PCT No.: PCT/EP2013/003560
§ 371 (c)(1),
(2) Date: May 26, 2015

(87) PCT Pub. No.: WO2014/082730
PCT Pub. Date: Jun. 5, 2014

(65) Prior Publication Data
US 2015/0300917 A1 Oct. 22, 2015

(30) Foreign Application Priority Data
Nov. 30, 2012 (FR) .................................. 12 61487

(51) Int. Cl.
*G01M 15/06* (2006.01)
*H03K 5/156* (2006.01)
(Continued)

(52) U.S. Cl.
CPC ........... *G01M 15/06* (2013.01); *F02D 31/005* (2013.01); *F02D 41/009* (2013.01);
(Continued)

(58) Field of Classification Search
CPC .. F02D 41/009; F02D 31/005; F02D 41/0097; H03K 5/156; H03K 5/26; F01L 2820/042; G01M 15/06
See application file for complete search history.

(56) References Cited

U.S. PATENT DOCUMENTS 6,781,341 B2 * 8/2004 Nakamichi ............. F02D 41/20
318/280
7,032,440 B2 * 4/2006 Kishibata .............. F02D 41/009
73/114.26
(Continued)

FOREIGN PATENT DOCUMENTS

JP 2005233622 A * 9/2005
JP 2012077646 A 4/2012

OTHER PUBLICATIONS

International Search Report, dated Apr. 22, 2014, from corresponding PCT application.

*Primary Examiner* — Freddie Kirkland, III
(74) *Attorney, Agent, or Firm* — Young & Thompson

(57) ABSTRACT

A method and device for processing a signal (CRK) provided by a bidirectional sensor, the method includes the following steps:
generation of a first signal (CRK_CNT) utilizing all the slots of the signal provided by the sensor,
generation of a second signal (CRK_DIR) utilizing the slots corresponding to a first direction of transit,
connection of the first signal (CRK_CNT) to the input of the first electronic component,
connection of the second signal (CRK_DIR) to a second component,
(Continued)

detection by the second component of edges of the signals received, determination of the direction of transit as a function of the presence or otherwise of an edge on the second signal (CRK_DIR) when a rising and/or falling edge is detected on the first signal, change of the value of the predefined threshold (THMI) in the first component upon each detection of an edge.

8 Claims, 6 Drawing Sheets

(51) Int. Cl.
    *H03K 5/26*     (2006.01)
    *F02D 41/00*     (2006.01)
    *F02D 31/00*     (2006.01)

(52) U.S. Cl.
    CPC ......... *F02D 41/0097* (2013.01); *H03K 5/156* (2013.01); *H03K 5/26* (2013.01)

(56) References Cited

U.S. PATENT DOCUMENTS

| | | | | |
|---|---|---|---|---|
| 7,208,944 B2 * | 4/2007 | Tatschl | ............... | G01D 5/2492 324/207.15 |
| 7,444,262 B2 * | 10/2008 | Hashizume | ............ | F02D 41/009 702/145 |
| 7,726,278 B2 * | 6/2010 | Sakaigaki | ............. | F02D 41/009 123/350 |
| 8,250,910 B2 * | 8/2012 | Rolew | .................. | F02D 41/009 702/151 |
| 8,818,685 B2 * | 8/2014 | Shimizu | .............. | F01L 1/34403 123/352 |
| 9,133,776 B2 * | 9/2015 | Shimizu | .............. | F02D 13/0238 |
| 2003/0218443 A1 | 11/2003 | Nakamichi et al. | | |
| 2009/0020100 A1 * | 1/2009 | Sakaigaki | ............. | F02D 41/009 123/350 |
| 2015/0315988 A1 * | 11/2015 | Hou | ..................... | F02D 41/009 701/102 |

* cited by examiner

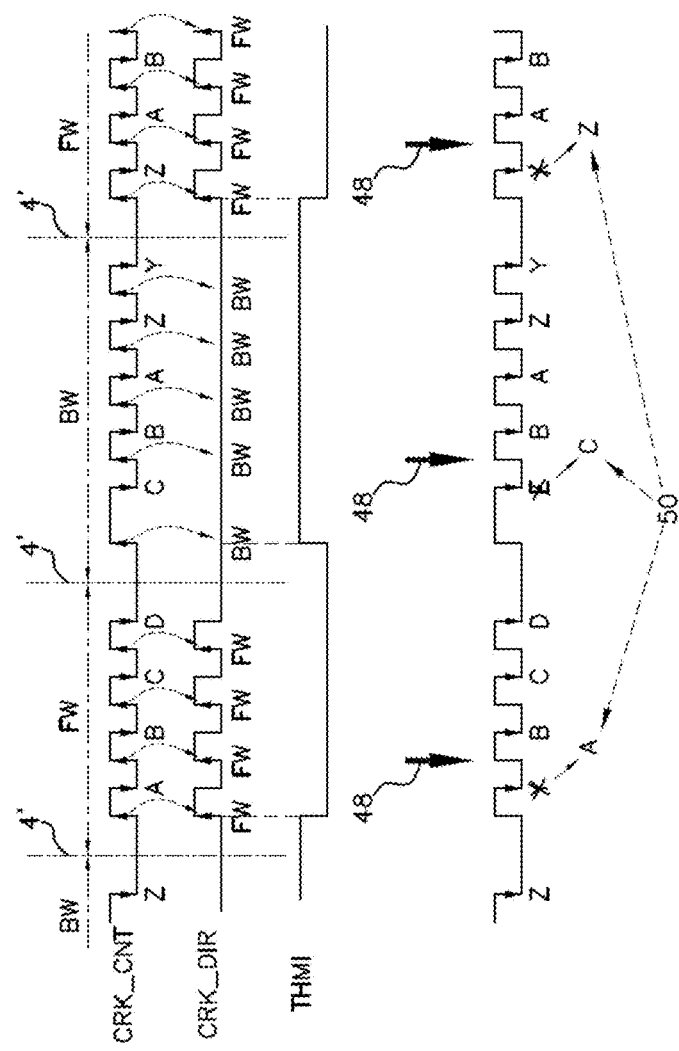

METHOD FOR PROCESSING A SIGNAL SUPPLIED BY A BI-DIRECTIONAL SENSOR AND CORRESPONDING DEVICE

BACKGROUND OF THE INVENTION

Field of the Invention

The present invention relates to a method for processing a signal provided by a bidirectional sensor as well as to a device for the implementation of such a method.

The field of the present invention is more particularly the field of the management of signals provided by sensors in an engine of a vehicle, for example an automotive vehicle, so as to determine parameters of the engine with a view to managing the proper operation of the latter.

Description of the Related Art

In an internal combustion engine, there is generally at least one movable piston for varying the volume of a combustion chamber. Admission and exhaust of fluids in combustion chambers are usually carried out with the aid of poppet valves controlled by at least one camshaft. The energy developed in the combustion chambers by combustion of a fuel within an oxidant is transmitted by each piston to a crankshaft.

For the management of the internal combustion engine, it is important to know the "phasing" (also called "synchronization") of the engine. The term "phasing" refers to the precise determination of the stroke of the engine cycle (for an internal combustion engine of 4-stroke type they are: admission, compression, combustion, exhaust) which the engine is in for each of its cylinders. The precise position within a stroke of the engine cycle is usually established by determining the position of the crankshaft. However, for an internal combustion engine of 4-stroke type, the duration of an engine cycle in a combustion chamber corresponds to two complete revolutions of the crankshaft. Thus, to ascertain the phasing of an internal combustion engine of this type, an additional item of information is necessary. It is then customary to obtain this item of information on the basis of a camshaft position sensor. Indeed, a camshaft has a rotation speed corresponding to half the rotation speed of the corresponding crankshaft and, therefore, traverses only one revolution over the duration of a complete 4-stroke engine cycle.

Customarily, the position sensor corresponding to the crankshaft cooperates with a target comprising a large number of teeth (generally thirty-six or sixty, without taking account of one or two missing teeth making it possible to define an origin on the target) while the target used in cooperation with the camshaft sensor exhibits only few teeth (for example four). The signal provided by the sensor corresponding to the crankshaft is then used to precisely ascertain the position of the crankshaft (and therefore of the pistons).

However, when the signal of this sensor is defective or noisy, provision is made to use the signal emanating from the sensor corresponding to a camshaft in degraded mode.

The signals provided by the sensors corresponding to the crankshaft and to at least one camshaft are injected into an electronic device, such as for example a generic timer module GTM. Within this module, a digital phase locked loop DPLL is provided for managing the synchronization of the engine position and generating an angular clock.

While the engine is stopping, the crankshaft oscillates about an equilibrium position corresponding to the engine stopping position. If it is desired to then rapidly start the engine after it has stopped, it is important to precisely ascertain the engine stopping position. Novel position sensors, also called bidirectional sensors, are making it possible, on the one hand, like the sensors of the prior art, to detect an edge corresponding to a tooth but also, on the other hand, to determine the direction of rotation of the corresponding target. A strategy integrated into the digital phase locked loop makes it possible to take account of the item of information relating to the direction of rotation of the target and thus to ascertain the position of the engine when the latter stops.

A bidirectional sensor of known type, for example from document JP 2005 233622, provides signals exhibiting an active level and an inactive level. The duration of active level depends on the direction of rotation of the target. For example, a double duration of active level can be chosen for a reverse rotation with respect to the duration of active level for a rotation in the usual direction. It is thus possible to determine for each new edge the corresponding direction of transit. A corresponding strategy in the digital phase locked loop is then used for the realization of the angular clock.

However, there exist bidirectional sensors operating according to another principle. The direction of rotation of the target is given in the signal by varying for example the voltage corresponding to the active level and/or to the inactive level. Such a sensor is also known from document JP 2005 233622, FIG. 6, whose signal comprises four different levels.

BRIEF SUMMARY OF THE INVENTION

The aim of the present invention is then to provide a method for processing a signal provided by a bidirectional sensor which makes it possible to provide an angular clock with a sensor giving an indication of the direction of rotation of the corresponding target, for example through a variation in voltage of the active level and/or of the inactive level, while the digital phase locked loop used is programmed to detect different durations of active level. Preferably, the method according to the invention will make it possible to carry out a reliable determination of the angular position of the corresponding engine. Furthermore, advantageously, the modifications to be afforded at the level of the corresponding electronic device will be limited.

For this purpose, the present invention proposes a method for processing a signal provided by a bidirectional sensor detecting the transit of teeth of a target with a view to generating an angular clock of an internal combustion engine with the aid of a first electronic component receiving the signal originating from the bidirectional sensor, said first component exhibiting means for determining, in a signal exhibiting low-level segments and high-level segments, whether the length of a segment of a given level is or is not greater than a predefined threshold, and the signal provided by the bidirectional sensor being a signal in the form of slots comprising at least low-level segments, high-level segments, and intermediate-level segments, each slot corresponding to the transit of a tooth of a target in front of the sensor and the signal also comprising characteristics making it possible to determine the direction of transit of the tooth.

According to the present invention, such a processing method comprises the following steps:
  generation of a first signal utilizing all the slots of the signal provided by the sensor but exhibiting only segments corresponding to a first level and segments corresponding to a second level,
  generation of a second signal utilizing the slots of the signal provided by the sensor and corresponding to a first direction of transit of a tooth in front of the sensor, and exhibiting a constant level during the rotation of the target in the second direction of transit, connection of the first signal to the input of the first electronic component, connection of the second signal to a second electronic component, detection by the second electronic component of rising and/or falling edges of the first signal and of the second signal, determination of the direction of transit as a function of the presence or otherwise of an edge on the second signal when a rising and/or falling edge is detected on the first signal, change of the value of the predefined threshold in the first component when the direction of transit determined at the previous step for a rising and/or falling edge of the first signal is different from the direction of transit determined for the just preceding rising and/or falling edge of this first signal, the threshold value being able to take either a first predefined value or a second predefined value in such a way that the length of the slots is always on one and the same side of the corresponding threshold.

The idea at the origin of the present invention is therefore, on the one hand, of adapting the signal so as to render it compatible with the component and, on the other hand, of changing the threshold value used by this component. In this way, the component becomes compatible with several bidirectional sensors. Furthermore, the adaptation of one sensor to another, as emerges from the description hereinafter given with reference to the appended figures, can be done while limiting the amount and the cost of the hardware means necessary for said adaptation.

The present invention also relates to an electronic device exhibiting means for the implementation of each of the steps of a processing method such as described hereinabove.

In one embodiment of an electronic device such as this, a generic timer module inside which are embedded the first component and the second component, as well as at least one third component outside the generic timer module for generating the first signal and the second signal can be envisaged.

In an electronic device according to the invention, the first component is for example a phase locked loop, especially a digital phase locked loop DPLL.

Finally, the present invention also relates to a management system of an internal combustion engine, characterized in that it comprises an electronic device such as described hereinabove as well as at least one bidirectional sensor.

BRIEF DESCRIPTION OF THE DRAWINGS

Details and advantages of the present invention will emerge better from the description which follows, given with reference to the appended schematic drawing in which.

DETAILED DESCRIPTION OF THE PREFERRED EMBODIMENTS

Figure 1:
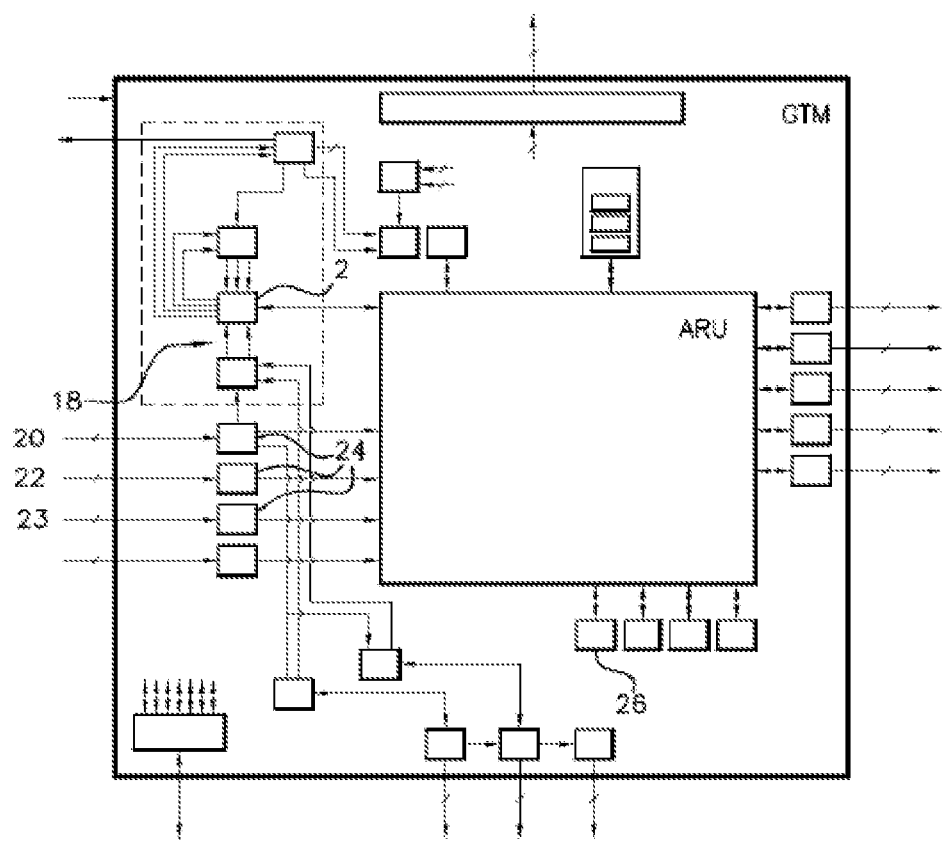
FIG. 1 illustrates a generic timer module that can be used for the implementation of the present invention.

FIG. 1 illustrates a generic timer module, subsequently called GTM. Such a module can be used within an internal combustion engine electronic management system. Inside this module is a first component 2 charged with managing the synchronization of the position of the corresponding engine as well as with generating an angular clock. This first component 2 is for example a digital phase locked loop, also called DPLL.

The first component 2 is known from the prior art. It generally receives two signals originating from sensors (not represented) embedded in the corresponding engine. A first signal originates from a sensor associated with a toothed target fastened to the crankshaft of the engine. Such a target generally comprises thirty-six or sixty teeth (without taking account of one or two missing teeth making it possible to introduce a discontinuity defining an origin point on the target), thereby yielding a precise signal to define the position of said crankshaft. The second signal used in the prior art with the first component 2 is a less precise signal originating for example from a sensor associated with a target rotating with a camshaft of the engine. However, as the rotation speed of a camshaft corresponds exactly to half the rotation speed of the crankshaft, the received signal originating from the camshaft makes it possible to ascertain the position of the engine over 720°, also called "phasing" or "synchronization" of the internal combustion engine.

For certain engines it is necessary to precisely ascertain the position of the engine when the latter has stopped. Now, when the engine stops, the crankshaft oscillates mechanically about its equilibrium position in which it will ultimately stop. The crankshaft then turns alternately in one direction and then in the other.

By convention, in the subsequent description the direction of rotation corresponding to the direction of rotation of the engine when running will be called the forward (or FW) direction of rotation. The opposite direction of rotation will be called the backward (or BW) direction of rotation.

In order to determine the position of the engine when stopped, it is required not only to detect the teeth of a target transiting in front of the corresponding sensor but also the direction of transit of these teeth. For this purpose, there exist sensors termed bidirectional sensors which provide a signal which, on the one hand, makes it possible to detect the transit of each tooth and, on the other hand, give an indication about the direction of transit of the corresponding tooth.

Figure 2:
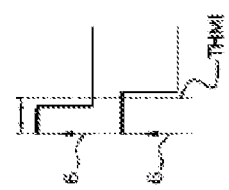
FIG. 2 illustrates a threshold value used in a component of the module of FIG. 1.
Figure 3:
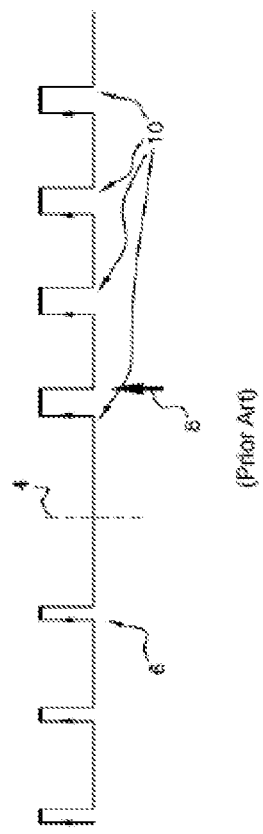
FIG. 3 illustrates a detection of direction of rotation of the prior art.

FIG. 3 illustrates an exemplary signal provided by a bidirectional sensor. It is noted that this signal is formed of slots of two different types. On the left of FIG. 3 are first slots of reduced length. Thereafter there is a dashed line 4 indicating here a change of direction of rotation of the internal combustion engine. To the right of this dashed line 4, the slots of the signal represented are of bigger width. Thus there are narrow slots and wide slots. FIG. 2 allows comparison of a narrow slot with a wide slot.

Each slot of the signal illustrated in FIG. 3 exhibits a first active edge 6. The latter is used for the management of the angular clock generated within the first component 2. The length of the slot is thereafter used to determine the direction of rotation of the tooth in front of the corresponding sensor. The first component 2 is indeed programmed so as, on the one hand, to detect the first active edge 6 and, on the other hand, to determine the length of the slot. A threshold value, called THMI, is recorded in a register of the first component 2. As long as the length of the slot remains below the value THMI, the first component considers that the tooth has transited in front of the sensor in the forward direction of rotation. In the converse case, it considers that the tooth has transited in front of the sensor in the backward direction of rotation.

In FIG. 3 is thus represented a signal corresponding firstly to the transit of three teeth in front of the corresponding sensor in the forward direction of rotation. The dashed line 4 illustrates, as mentioned above, the change of direction of rotation of the crankshaft, and therefore of the target associated therewith. The following tooth then transits in front of the sensor traveling backwards. One is therefore dealing with the tooth which has just transited in front of the sensor traveling forwards, just before the change of direction of rotation of the crankshaft. The detection by the first component of the change of direction illustrated by the dashed line 4 is carried out only when the corresponding slot has been analyzed by the first component 2, that is to say substantially at the date illustrated schematically in FIG. 3 by the arrow 8. The second edges 10 of the slots of the signal illustrated in FIG. 3 are considered to be inactive edges since they do not correspond to a change of shape on the target. However, these second edges 10 are used for determining the direction of rotation of the crankshaft.

This prior art detection strategy works. However, novel bidirectional sensors with different modes of operation from that described hereinabove are appearing and are providing signals of different shapes from those shown in FIG. 3. The problem that the present invention proposes to solve is to allow the use of the first component 2 to generate an angular clock with signals of a different type from that illustrated by FIGS. 2 and 3.

Figure 4:
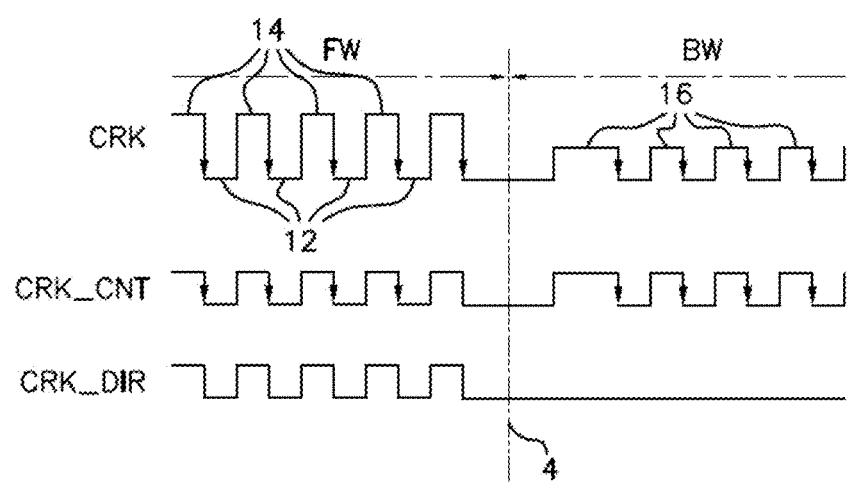
FIG. 4 illustrates a first signal provided by a bidirectional sensor and two signals obtained on the basis of this first signal, FIG. 5 schematically illustrates a step of determining the direction of transit of a tooth of a target that can be implemented in the present invention.

It is assumed by way of illustrative but nonlimiting example that the signals provided by a novel bidirectional sensor are of the type of the signal CRK of FIG. 4. It is noted that this signal is in the form of slots. However, whereas the signals illustrated in FIGS. 2 and 3 exhibited only a bottom level and a top level, it is noted that the signal CRK of FIG. 4 comprises low-level segments 12, high-level segments 14 and intermediate-level segments 16. The low level corresponds for example to a voltage of 0 V, the high level for example to a voltage of 5 V while the intermediate level can correspond to a voltage of 2.5 V. In a signal CRK, when the voltage difference at the level of a slot is of the order of 5 V, this signifies that the tooth transits in front of the sensor in the forward direction of rotation. When the voltage difference at the level of a slot is of the order of 2.5 V, this then signifies that the tooth transits in front of the corresponding sensor in the backward direction of rotation.

In FIG. 4 a dotted line 4 has been represented which corresponds to a change of direction of the crankshaft. As a function of the sensor, the active edge of a slot of the signal can be either the first rising edge, or the second falling edge. In FIG. 4, the active edges are labeled by an arrow on the signal. It is noted here that the active edges of the signal CRK are the falling edges.

It is clearly noted that signals of this type cannot be processed as is by the first component 2. The present invention proposes to render such signals compatible with the first component 2 described above.

It is proposed here to process the signal obtained by the bidirectional sensor so as to generate two distinct signals called in FIG. 4 CRK_CNT and CRK_DIR.

The first signal CRK_CNT utilizes all the rising edges and the falling edges of the signal CRK and thus forms slots. Here, however, provision is made for the signal CRK_CNT to have only low-level segments and high-level segments. The low level can correspond to a voltage of 0 V while the high level can correspond to a voltage of 2.5 or 5 V for example.

The second signal CRK_DIR is a signal similar to the signal CRK_CNT but for which the slots corresponding to transits of teeth in the backward direction of rotation are "erased". This second signal CRK_DIR is therefore such that when the crankshaft rotates backwards, the level of this second signal CRK_DIR is constant. As illustrated in FIG. 4, the constant level can be the low level but it could also be the high level, in the case where the change of direction of rotation were to take place when the signal CRK is at its high level.

It is proposed that the first signal CRK_CNT be injected on a first input 18 of the first component 2. This first input 18 is that provided for receiving a signal of the type of that illustrated in FIG. 3. The first signal CRK_CNT is then injected on second input 20 of the module GTM at the level of an electronic component of second component 24 type. The latter automatically retransmits, without lag, the signal received on the first input 18 of the first component 2.

The second signal CRK_DIR is injected on a third input 22 of the module GTM. It is also injected at the level of a component of second component 24 type. The latter is intended to detect the edges of the signals that it receives at its input. This also holds for the component associated with the second input 20. Both for the first signal CRK_DIR and for the second signal CRK_CNT the second components 24 can thus detect the active edge of each of these signals (here this may be the rising edge or the falling edge but in the typical case represented it is the falling edge).

It should be noted here that for their processing, the signals may, if necessary, be filtered. It will then be appropriate to take care to limit the duration (delay) of the filter.

The item of information, provided by the second components 24, regarding level is dispatched directly to a sequencer 26 of the module GTM by way of a transmission module called in FIG. 1 ARU. The sequencer 26 is permanently on standby awaiting an active edge on the first signal CRK_CNT containing the set of slots of the signal CRK corresponding to the teeth of the target associated with the bidirectional sensor. For each new slot, or more precisely for each active edge, detected by the sequencer 26, the latter will verify whether there is a corresponding edge on the second signal CRK_DIR. If such an edge is detected on the second signal CRK_DIR, then the corresponding tooth of the target has transited in front of the corresponding bidirectional sensor in the forward direction of rotation. In the converse case, it is considered that the tooth corresponding to the active edge detected on the first signal CRK_CNT has transited in front of the sensor in the reverse direction.

Thus, upon each detection of change of direction, the sequencer 26 uses a software interrupt request associated with this sequencer 26. This interrupt request is carried out at an electronic component external to the GTM. This external component is for example a component of the DMA ("Direct Memory Access") type. The interrupt at the DMA component is associated with an automatic transfer which is used to vary the value of the register THMI defined above, with reference especially to FIG. 2.

In the associated electronic memory, a buffer memory, or just buffer, contains two values. It is proposed here that values THMI_MIN and THMI_MAX be chosen as values for the buffer memory.

A first value, for example THMI_MAX, of the buffer memory corresponds to a value which, when it is recorded in the register THMI, is such that it is always greater than the length of a slot. It is for example the maximum value that can be taken by the register THMI. It is then considered, by default, that the target is rotating forwards.

The second value, THMI_MIN is for its part a value intentionally chosen to be very low so that the first component 2 then sees all the slots as being wide slots, that is to say having a greater width than the threshold width. For example, THMI_MIN can be given the value "1" (and the value "0" can be retained as value which totally deactivates the direction detection strategy). In this typical case, as explained above, it is therefore considered that the target transits in front of the bidirectional sensor in the backward direction of rotation.

Thus, whenever a software interrupt is requested, passing via the component of DMA type, the value of the register THMI is modified instantaneously, thus switching successively from the value THMI_MIN and then THMI_MAX, and so on and so forth. The time to perform a change of the value of the register THMI is very short and remains less than the duration of the active level. Thus the value of this register is changed before the inactive edge is processed using said value. Likewise, if a detection is made on an inactive edge, the change of register value will be effective for the following active edge.

All the steps described relating to the change of value in the register THMI, from the detection of the active edge on the first signal, are carried out instantaneously and do not cause any delay. There is therefore a shiftless updating of the first component 2 when a change of direction is detected. Other means may be implemented to change the value of the register THMI. Software processing within an associated microprocessor may for example be envisaged. In an internal combustion engine management system, this solution can be envisaged since the detection of reverse direction of rotation is performed only when the engine stops, that is to say at very low revs, and therefore at a moment when the software loading is low.

Figure 6:
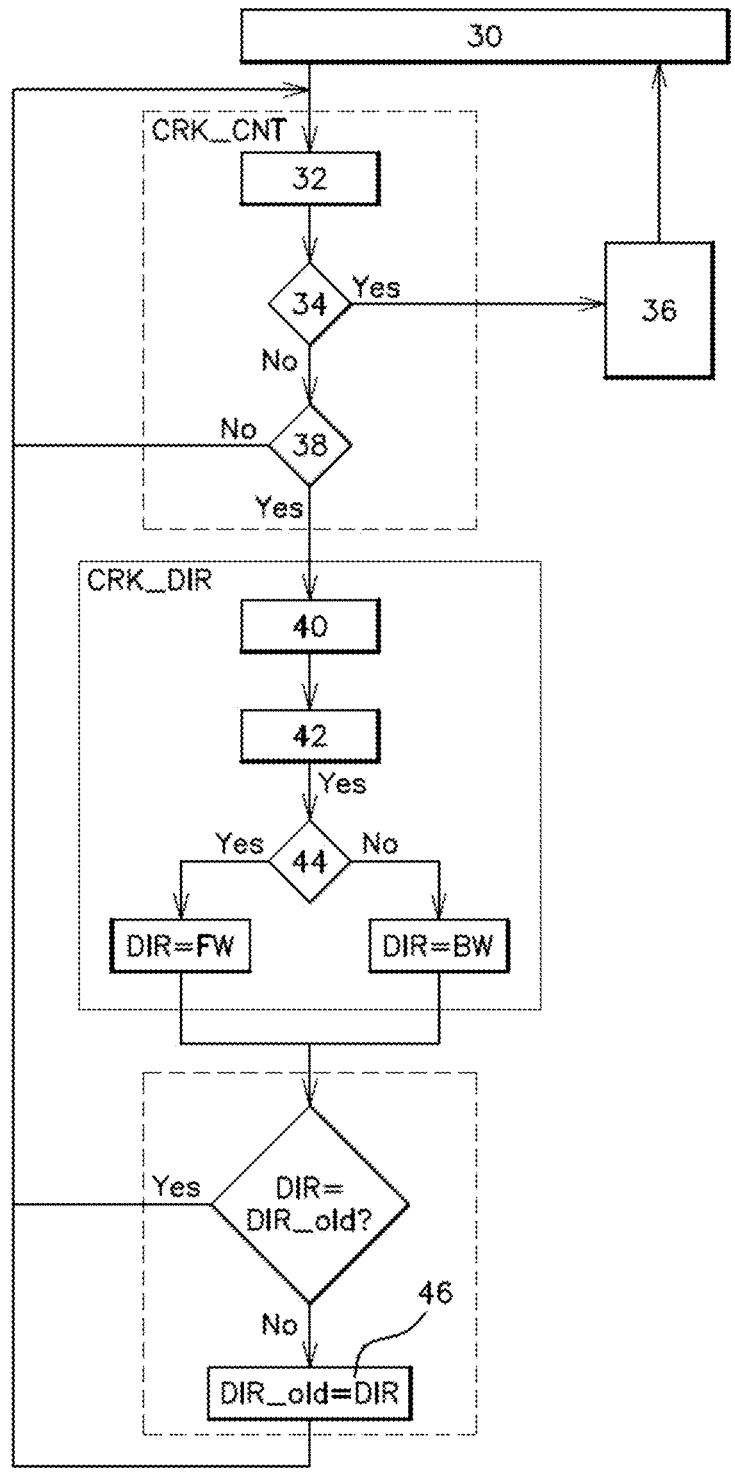
FIG. 6 is a flowchart that can be used for the implementation of the present invention, and FIG. 7 schematically illustrates an implementation of the present invention.

FIG. 6 presents in the form of an algorithm a processing of the detection of the change of direction within the sequencer 26. A first step 30 is an initialization step. The direction detection begins only if the system is ready to operate. Upon starting an engine, the latter is always propelled in the same direction which corresponds to the forward direction of rotation. Upon starting, the sequencer 26 therefore considers the target to be rotating in the forward direction of rotation. In the course of step 32 it analyzes the signal CRK_CNT transmitted by the ARU on standby awaiting an edge on this signal. During this standby the ARU may receive a command from an associated microprocessor (box 34) requesting cessation of operation and therefore the detection of direction of rotation. A step 36 is then provided for halting the detection of direction of rotation of the crankshaft. This solution may correspond for example to the typical case in which the engine stalls or in case of loss of "synchronization" (or "phasing"). In this case, the initialization process (step 30) is relaunched.

Figure 5:
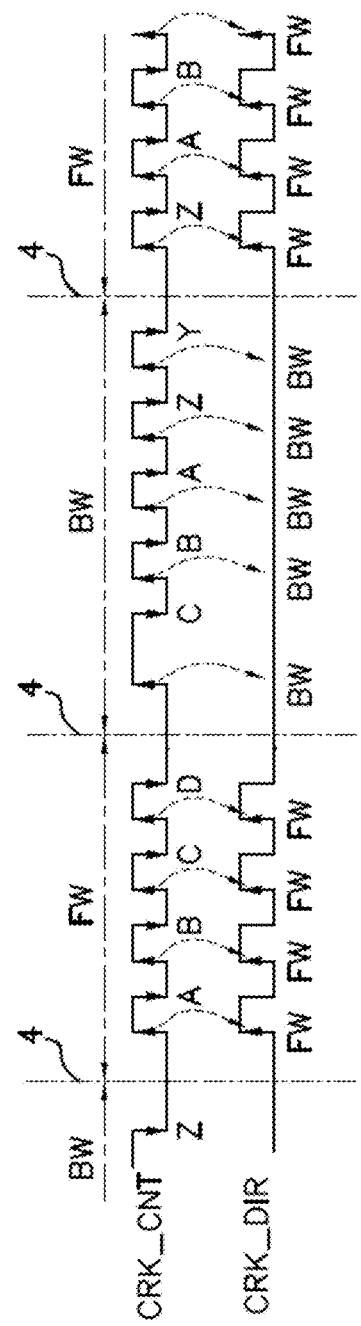

As long as no command is received from the associated microprocessor, monitoring continues until detection of an edge on the signal CRK_CNT is obtained (step 38). During this step 38, the sequencer 26 verifies whether this is an edge used to determine a possible change of direction. Here it may be a rising or falling edge. In the illustrative example represented in the drawing, it is chosen here to retain the falling edges (cf. also FIG. 5). If not, then the sequencer 26 waits for the following edge on the first signal CRK_CNT (step 32). On the other hand, if the detected edge is an edge used to determine a possible change of direction, an analysis of the signal CRK_DIR will commence. This analysis begins with a standby step 40, optional, envisaged for example if one of the signals is filtered, so as to ensure that a corresponding edge will be detected on the second signal CRK_DIR even in the case of (slight) delay. The following step is a step of analysis 42 of the signal CRK_DIR. If an edge is then detected on this signal (box 44), the direction of rotation (DIR) of the tooth in front of the sensor is the forward (FW) direction of rotation. In the converse case, this direction of rotation is the backward (BW) direction of rotation.

In both typical cases (forward or backward direction of rotation), the direction of rotation DIR thus determined is compared with a value recorded in a register DIR_old. Provision may for example be made for the value "0" to be associated with the forward (FW) direction of rotation while the value "1" would be associated with the backward (BW) direction of rotation.

If the detected direction of rotation corresponds to the direction of rotation stored in the register DIR_old, there is no change of direction of rotation and detection can continue (return to step 32).

On the other hand, if the direction of rotation detected is different from that stored in the register DIR_old, a software interrupt is requested (step 46) and the latter leads to a change of the value of the register THMI. Simultaneously, the value of the register DIR_old is changed and takes a value corresponding to the newly detected direction of rotation (DIR). The process continues with a return to step 32.

FIG. 7 illustrates the present invention with the aid of the signals generated on the basis of the signal provided by the bidirectional sensor. Chain-dotted lines 4' corresponding to changes of direction have been represented in this figure. On the left of the figure, it is assumed that the target is rotating backwards. The directions of rotation (BW for backward and FW for forward) are mentioned at the top of FIG. 7.

The signal CRK_CNT is represented. It exhibits a shape of slots and first arrows illustrate the rising edges used for detection of a possible change of direction and second arrows (falling edges), each time representing the active edge of a slot. For the present illustration, the teeth of the target have been numbered with letters of the Latin alphabet.

Below the signal CRK_CNT is the signal CRK_DIR. On this signal, an arrow indicates the edges used for detecting a possible change of direction. Below the signal CRK_DIR, a chart illustrates the values taken by the register THMI. To each edge corresponding to a change of direction detected on the signal CRK_CNT with the aid of the signal CRK_DIR there corresponds a change of the value of the register THMI.

The last line in FIG. 7 corresponds to the processing done by the first component 2 (DPLL). The signal received by this first component corresponds to the signal CRK_CNT which is injected into the first input 18 of this component. Arrows 48 illustrate the detection of the change of direction by the first component 2. It is noted that this detection of change of direction is carried out with a delay of one tooth. On account of the detection delayed by the first component 2 of the change of direction, it is appropriate to correct the number of the tooth detected by the first component 2 just before detecting the change of direction. These automatic corrections 50 are illustrated at the bottom of FIG. 7. Thus, the first component 2 correctly analyzes the signal received and can provide an exact angular clock.

The main advantage presented by the solution proposed by the present invention is that of allowing the use of a component adapted for processing a type of signal provided by one bidirectional sensor to another bidirectional sensor providing different signals. The internal strategy of the digital phase locked loop for detecting a change of direction is unchanged.

This adaptation is carried out here while limiting the electronic means to be implemented to carry out this adaptation. The electronic hardware necessary here corresponds only to the means for processing the signal of the bidirectional sensor. Such means cost much less than the development and the fabrication of an electronic component integrating an adapted software solution (ASIC).

The solution proposed here has the advantage furthermore of having no impact on the loading of a microprocessor. The solution described hereinabove uses only the internal resources of the generic timer module (GTM), in conjunction with the component of DMA type. This also has the advantage of having immediate processing which eliminates any risk of uncontrolled desynchronization related to a delay in the change of configuration of the digital phase locked loop.

The strategy proposed here is flexible. It can adapt to various types of bidirectional sensors, especially diverse types of sensors with variable voltage and with different types of behavior in case of change of direction. Furthermore, as emerges from the preceding description, it can also adapt to the hardware environment. It may be noted here that this flexibility could not be achieved with the use of an ASIC ("Application-Specific Integrated Circuit").

Of course, the present invention is not limited to the embodiment described hereinabove by way of nonlimiting example and to its variant embodiments mentioned. It also relates to all variant embodiments within the scope of the person skilled in the art on the basis of this description.

The invention claimed is:

1. A method for processing a signal provided by a bidirectional sensor detecting the transit of teeth of a target with a view to generating an angular clock of an internal combustion engine with the aid of a first electronic component receiving the signal originating from the bidirectional sensor, said first component determining, in a signal exhibiting low-level segments and high-level segments, whether the length of a segment of a given level is or is not greater than a predefined threshold the signal provided by the bidirectional sensor being a signal in the form of slots comprising at least low-level segments, high-level segments, and intermediate-level segments, each slot corresponding to the transit of a tooth of a target in front of the sensor, and the signal comprising characteristics enabling determining the direction of transit of the tooth, the method comprising the following steps:

generating a first signal utilizing all the slots of the signal provided by the sensor but exhibiting only segments corresponding to a first level and segments corresponding to a second level;

generating a second signal utilizing the slots of the signal provided by the sensor and corresponding to a first direction of transit of a tooth in front of the sensor, and exhibiting a constant level during the rotation of the target in a second direction of transit;

connecting the first signal to the input of the first electronic component;

connecting the second signal to a second electronic component;

detecting, by the second electronic component, rising and/or falling edges of the first signal and the second signal;

determining the direction of transit as a function of the presence or not of an edge on the second signal when a rising and/or falling edge is detected on the first signal; and changing the value of the predefined threshold in the first component when the determined direction of transit determined at the previous step for the rising and/or falling edge of the first signal is different from the direction of transit determined for the just preceding rising and/or falling edge of the first signal, the threshold value taking one of a first predefined value that is a maximum value and a second predefined value that is a minimum value such that the length of the slots is always on one and the same side of the corresponding threshold.

2. An electronic device comprising:
one or more processors configured to implement the processing method as claimed in claim 1.

3. The electronic device as claimed in claim 2, further comprising a generic timer module inside which are embedded the first component, the second component, and at least one third component outside the generic timer module to generate the first signal and the second signal.

4. The electronic device as claimed in claim 3, wherein the first component is a phase locked loop.

5. A management system of an internal combustion engine, comprising:
the electronic device as claimed in claim 3; and
at least one bidirectional sensor.

6. The electronic device as claimed in claim 2, wherein the first component is a phase locked loop.

7. A management system of an internal combustion engine, comprising:
the electronic device as claimed in claim 6; and
at least one bidirectional sensor.

8. A management system of an internal combustion engine, comprising:
the electronic device as claimed in claim 2; and
at least one bidirectional sensor.

* * * * *